(12) United States Patent
Eller

(10) Patent No.: US 6,350,130 B1
(45) Date of Patent: Feb. 26, 2002

(54) ELECTRICALLY COUPLING AN AVIONICS LINE REPLACEABLE UNIT WITH AN AVIONICS TEST STATION

(75) Inventor: Roger D. Eller, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 09/323,776

(22) Filed: Jun. 1, 1999

(51) Int. Cl.[7] .............................................. H01R 12/00
(52) U.S. Cl. ........................ 439/61; 439/247; 439/248
(58) Field of Search .......................... 439/61, 248, 247; 324/760, 158.1, 73.1

(56) References Cited

U.S. PATENT DOCUMENTS

| | | | |
|---|---|---|---|
| 4,968,263 A | * 11/1990 | Silbernagel et al. | 439/246 |
| 5,055,055 A | * 10/1991 | Bakker | 439/78 |
| 5,137,462 A | * 8/1992 | Casey et al. | 439/74 |
| 5,227,955 A | * 7/1993 | Le Bris et al. | 361/395 |
| 5,268,637 A | * 12/1993 | Liken et al. | 324/158 |
| 5,402,319 A | * 3/1995 | Shumaker et al. | 361/796 |
| 6,042,392 A | * 3/2000 | Tsuji | 439/76.1 |

OTHER PUBLICATIONS

U.S. application No. 09/323,196, Eller, filed Jun. 1, 1999. "System And Method For Electrically And Mechanically Coupling An Avionics Line Replaceable Unit With Electronic Equipment" by Roger Eller, Filed Jun. 1, 1999, Docket No. 99CR062/KE.

* cited by examiner

*Primary Examiner*—Brian Sircus
*Assistant Examiner*—Son V. Nguyen
(74) *Attorney, Agent, or Firm*—Nathan O. Jensen; Kyle Eppele

(57) ABSTRACT

An avionics test unit adapter for interfacing between an avionics test station and an avionics line replaceable unit, where the test unit adapter is blind mated with both. The test unit adapter has therein at least two rigid circuit cards used for signal distribution or transmission. The two rigid circuit cards being rigidly coupled to each other through an edge connector while each circuit card is mounted within the test unit adapter with the ability to float therein in at least three orthogonal directions.

20 Claims, 5 Drawing Sheets

ELECTRICALLY COUPLING AN AVIONICS LINE REPLACEABLE UNIT WITH AN AVIONICS TEST STATION

CROSS REFERENCE TO RELATED PATENT APPLICATIONS

The present application is related to co-pending patent application entitled "System and Method For Electrically and Mechanically Coupling an Avionics Line Replaceable Unit With Electronic Equipment", filed on even date herewith by the same inventor and assigned to the same assignee. This application is incorporated herein in its entirety by this reference.

FIELD OF THE INVENTION

The present invention generally relates to aviation electronics, or avionics, and more particularly relates to line replaceable units (LRUs) of avionics equipment which are mated to a rack in an aircraft, and even more particularly relates to a system and method for electrically and mechanically coupling such LRUs with a ground-based test station and/or airframe LRU interfaces.

BACKGROUND OF THE INVENTION

In the past, designers of avionics systems have endeavored to provide systems with improved reliability and improved serviceability. One crucial element in such systems has been the use of avionics test stations on the ground to test avionics equipment when removed from aircraft. These test stations are typically very versatile, being capable of testing various different types of avionics equipment. The versatility of these test stations arises out of the use of various test unit adapters (TUAs) which are tailored to electrically connect various avionics LRUs with the test station.

While these test stations and TUAs have many advantages, they also have significant drawbacks.

First of all, the TUAs are typically individually hand wired to interface each LRU to a test station. This hand wiring of the TUAs is expensive and time-consuming because of the high degree of skill and care which is needed to accomplish the task. Secondly, servicing TUAs is often a difficult and time-consuming task because great care must be taken in rewiring the TUA to accomplish any service changes. Consequently, there exists a need for improvement in systems and methods for testing LRUs.

SUMMARY OF THE INVENTION

It is an object of the present invention to provide enhanced reliability for avionics LRUs and avionics test equipment.

It is a feature of the present invention to utilize a TUA with rigid interconnections between the LRU and the test station.

It is an advantage of the present invention to reduce the production time required to manufacture a particular TUA for a particular LRU.

It is another advantage of the present invention to increase the reliability of TUAs.

It is yet another advantage of the present invention to improve the serviceability of TUAs.

The present invention is an apparatus and method for testing avionics LRUs which is designed to satisfy the aforementioned needs, provide the previously stated objects, include the above-listed features and achieve the already articulated advantages. The present invention is carried out with a "hand wired-less TUA" in a sense that the amount of hand wiring in the manufacture and servicing of TUAs has been greatly reduced.

Accordingly, the present invention is a system and method for testing avionics LRUs where the system includes a TUA having rigid electrical connections, and the method includes providing a TUA having rigid electrical connections between the LRU and the test station.

BRIEF DESCRIPTION OF THE DRAWINGS

The invention may be more fully understood by reading the following description of the preferred embodiments of the invention, in conjunction with the appended drawings wherein.

DETAILED DESCRIPTION

Figure 1:
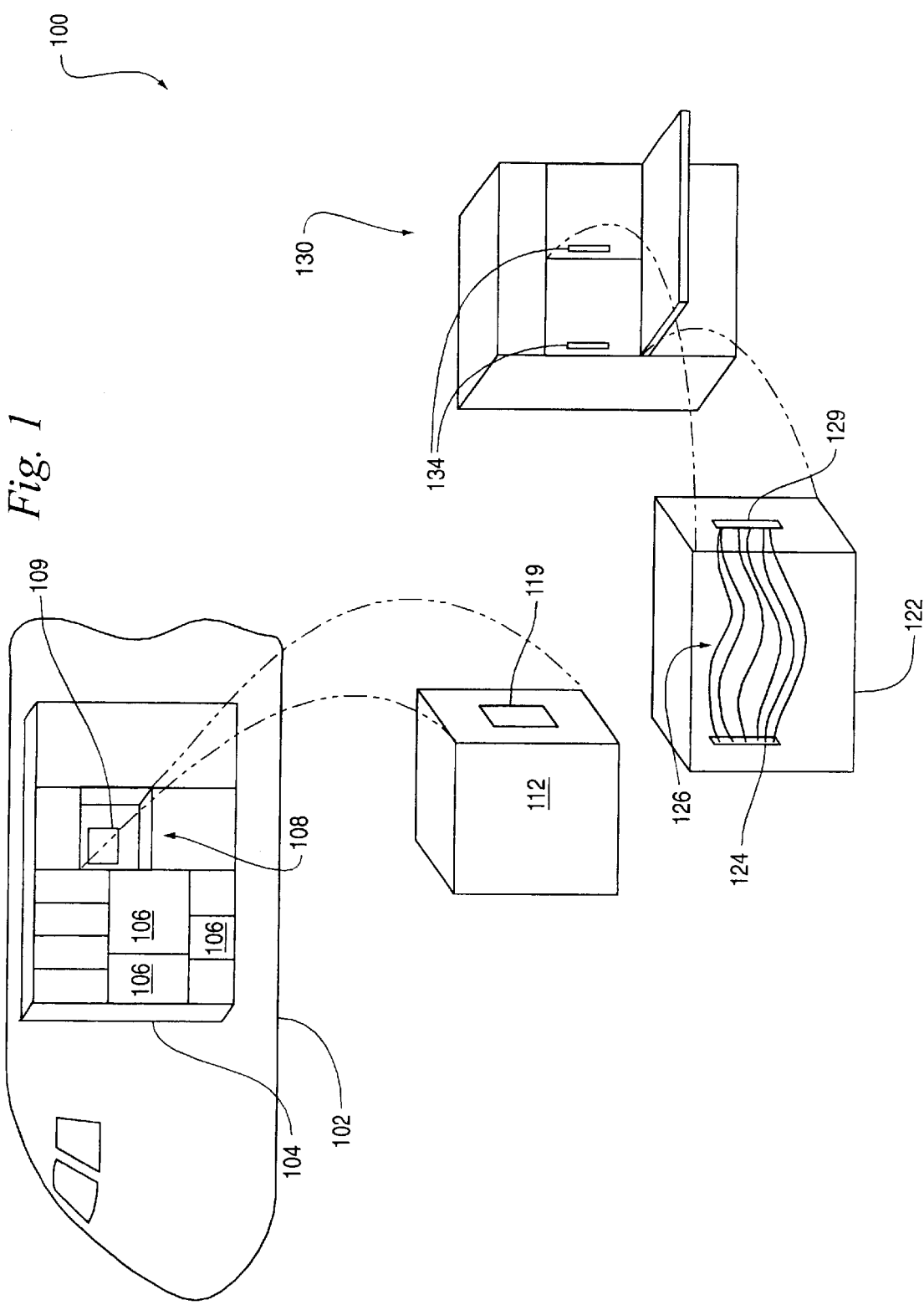
FIG. 1 is a simplified exploded diagram of a system and environment of the prior art, where the dotted and dashed lines show the orientation of objects when in an assembled state.

Now referring to the drawings, wherein like numerals refer to like matter throughout, and more particularly to FIG. 1, there is shown a system of the prior art, generally designated 100, which includes in an aircraft 102, an on-board avionics rack 104, with several avionics line replaceable units 106 disposed therein. On-board avionics rack 104 is shown having an unoccupied slot 108 therein with an on-board rack mounted rack/LRU connector interface 109 disposed at its inside end. Non-installed avionics line replaceable unit 112 is shown removed from unoccupied slot 108 and is shown having a avionics line replaceable unit rear blind mating connector interface 119 for coupling with on-board rack mounted rack/LRU connector interface 109. On-board rack mounted rack/LRU connector interface 109 and avionics line replaceable unit rear blind mating connector interface 119 are often, but are not necessarily, of a standardized design set by aviation standard setting body ARINC. Also shown in FIG. 1 is hand-wired TUA 122 having a TUA/LRU connector 124, a TUA/test station connector 129, and hand-wired interconnection wires 126 disposed therebetween. Hand-wired TUA 122 is shown as removed from one of two TUA docking stations 132 of test station 130. Each TUA docking station 132 has a test station/TUA connector 134 therein for coupling with TUA/ test station connector 129 of hand-wired TUA 122. TUA/ LRU connector 124 may be of similar or identical design to on-board rack mounted rack/LRU connector interface 109 and consequently, TUA/LRU connector 124 is capable of receiving avionics line replaceable unit rear blind mating connector interface 11 9 of non-installed avionics line replaceable unit 112.

Figure 2:
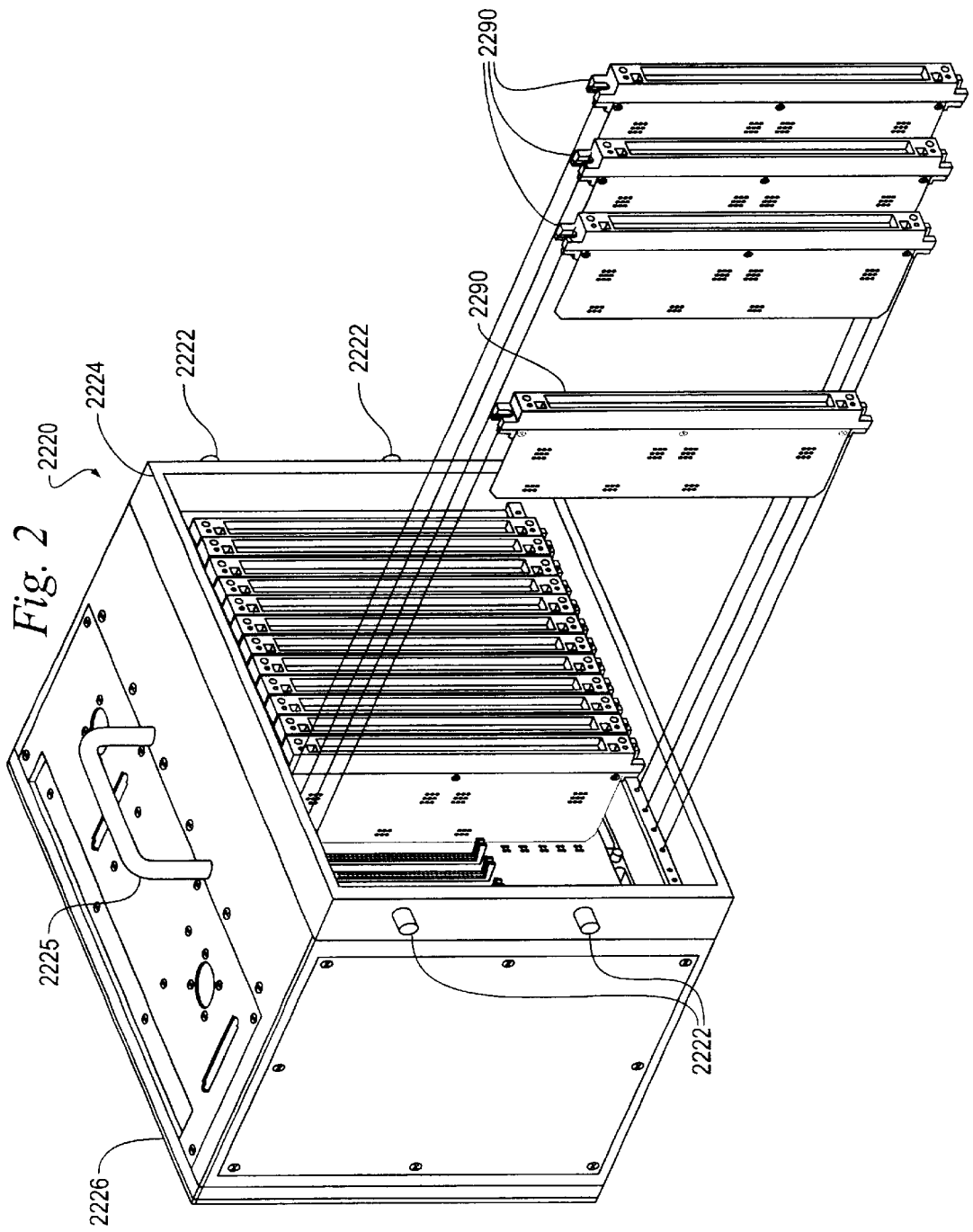
FIG. 2 is an exploded perspective view of a test station side of a TUA, where the dotted and dashed lines show the orientation of objects when in an assembled state.

Now referring to FIG. 2, there is shown a rigid interconnection TUA 2220, of the present invention, which is an improvement over prior art TUAs, such as hand-wired TUA 122 of FIG. 1. Rigid inter-connection TUA 2220 is shown having a test station side 2224 and an LRU side 2226 with docking station locking pins 2222 disposed near the test station side 2224. TUA handle 2225 may be included to aid in docking and undocking of the rigid inter-connection TUA 2220. Rigid inter-connection TUA 2220 is shown having a group of rigid TUA/test station connector assemblies 2290 disposed therein. Each rigid TUA/test station connector assembly 2290 has a printed circuit card having a TUA/test station connector printed circuit card first side 2291.

Figure 3:
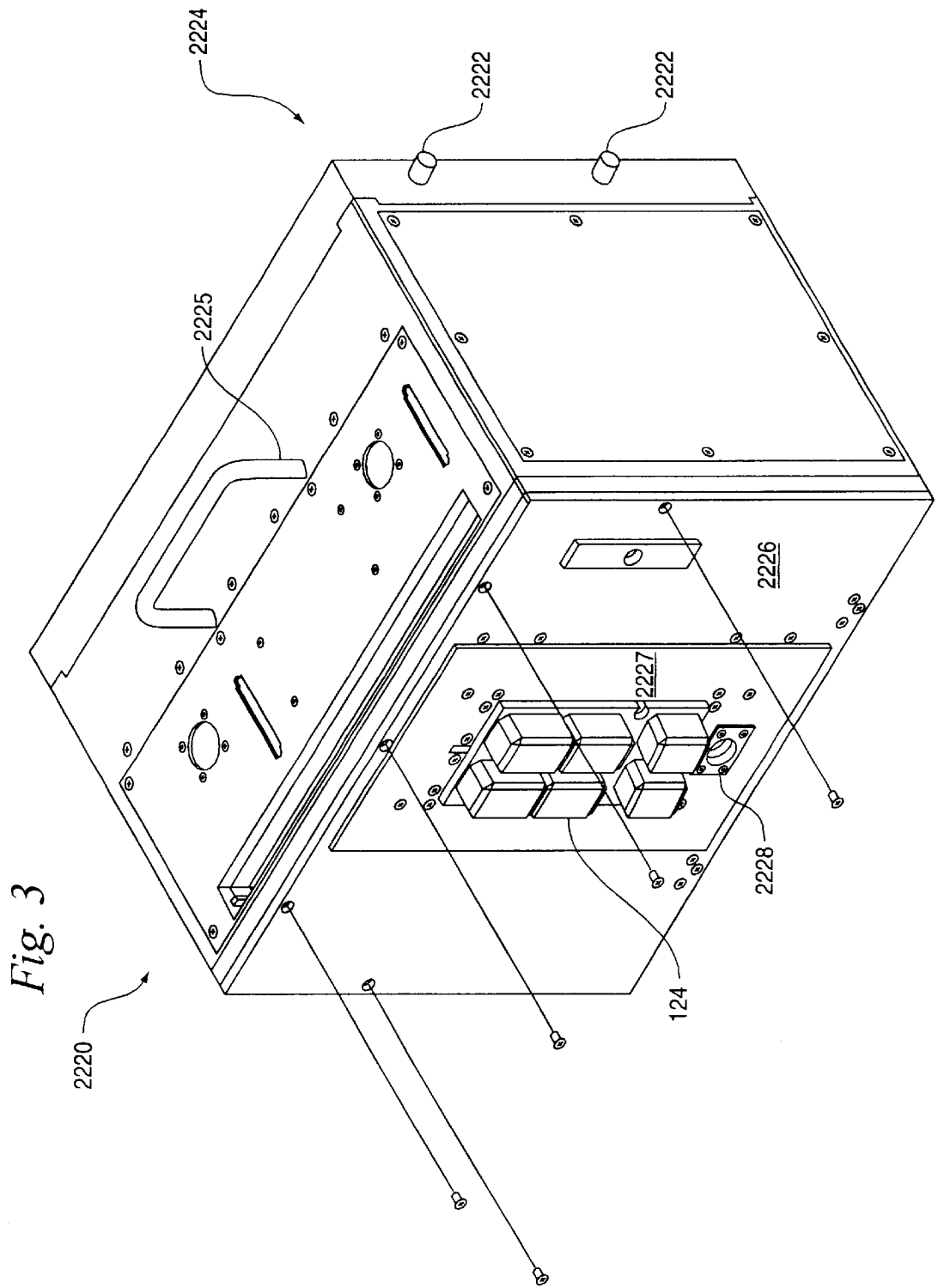
FIG. 3 is a perspective view of an LRU side of a TUA.

Now referring to FIG. 3, there is shown another perspective view of the rigid inter-connection TUA 2220 of FIG. 2, which shows an avionics line replaceable unit TUA/LRU connector 124 disposed on floating connector plate 2227 on LRU side 2226. Shown on floating connector plate 2227 is a floating connector plate alignment hole 2228. Avionics line replaceable unit TUA/LRU connector 124 may be an ARINC connector, or any other type of multi-pin connector, which can perform the necessary interface functions.

Figure 4:
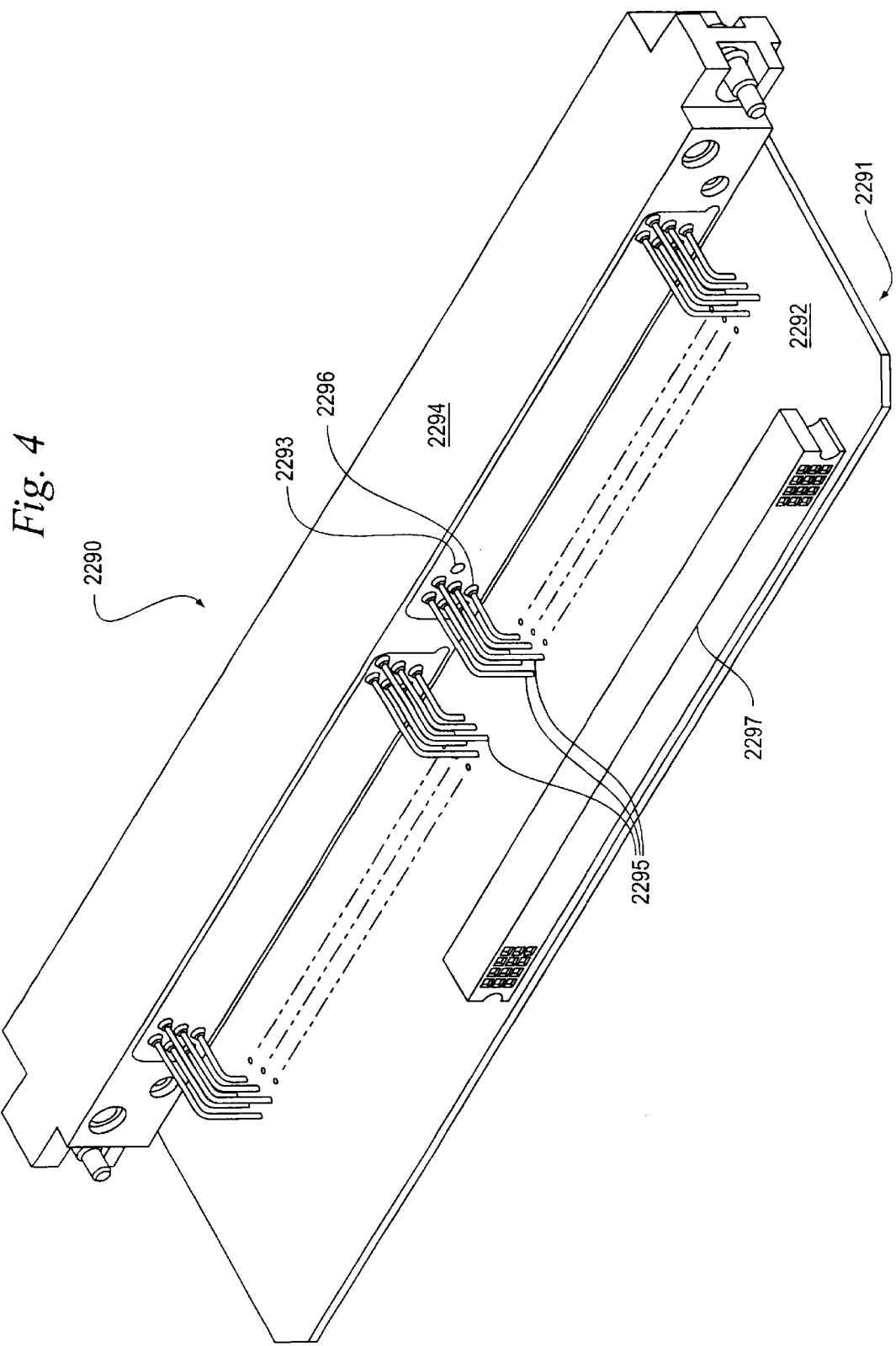
FIG. 4 is an enlarged perspective view of an opposite side of rigid TUA/test station connector assembly 2290 of FIG. 2.

Now referring to FIG. 4, there is shown an enlarged perspective view of an opposite side of rigid TUA/test station connector assembly 2290, as is shown in FIG. 2. Also shown is TUA/test station connector printed circuit card first side 2291 and TUA/test station connector printed circuit card second side 2292, which has disposed thereon TUA/test station connector housing 2294 with numerous TUA/test station connector pin holes 2293 therein. TUA/test station connector housing 2294 may be similar to well-known connectors used in prior art TUAs, and may be individually floated as was done in prior art TUAs. Disposed in some of the TUA/test station connector pin holes 2293 are TUA/test station connector pins 2295 which may be surrounded by TUA/test station connector pin hole tabs 2296. TUA/test station connector pins 2295 are preferably floating pins, which are formed to provide a strain relieve between the TUA/test station connector printed circuit card second side 2292 and the TUA/test station connector housing 2294. TUA/test station connector pin hole tabs 2296 may be made of any suitably resilient material. Circuit traces (not shown) connect TUA/test station connector pins 2295 with appropriate sockets in internal test station/mother board interface edge connector 2297.

Figure 5:
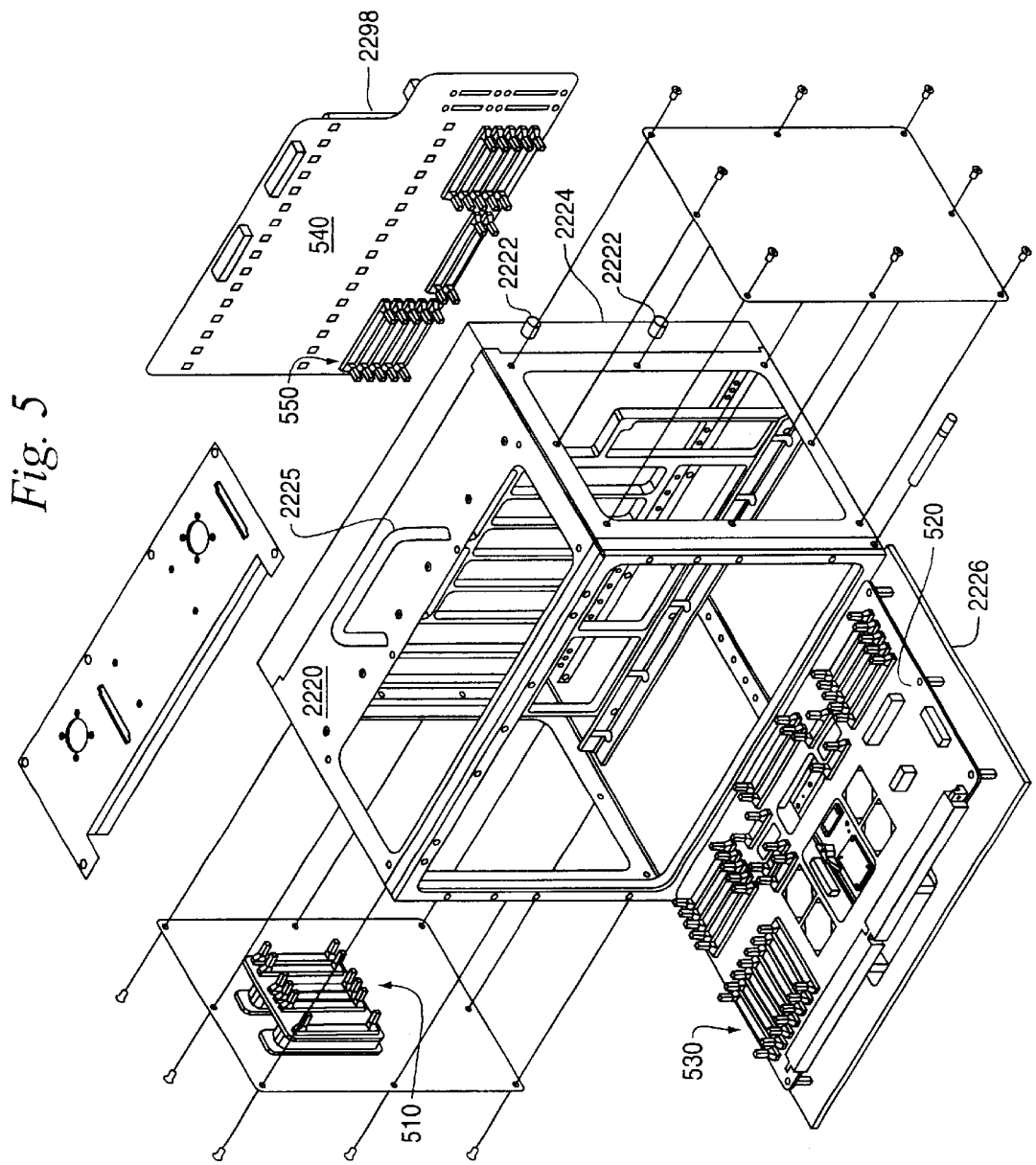
FIG. 5 an exploded perspective view of a TUA of FIG. 2 in which connecting cables are not shown.

Now referring to FIG. 5, there is shown an exploded perspective view of the TUA 2220 of FIG. 2, which shows a LRU side distribution card 520 with LRU side cable connectors 530 thereon. LRU side distribution card 520 may be any type of printed circuit board which is capable of distributing signals input thereto to various output connectors. Avionics line replaceable unit TUA/LRU connector 124 is coupled to LRU side 2226 of rigid inter-connection TUA 2220, and the rear side of avionics line replaceable unit TUA/LRU connector 124 is coupled to LRU side distribution card 520. Depending on the connection between avionics line replaceable unit TUA/LRU connector 124 and LRU side 2226, the electrical connection between avionics line replaceable unit TUA/LRU connector 124 and LRU side distribution card 520 may be pendant cables (if a floating connector is used) or rigid connections if a non-floating connection is utilized. More details on a particular design for the connection of avionics line replaceable unit TUA/LRU connector 124 with LRU side 2226 are given in the above-referenced co-pending application. Also shown are side port connectors 510 and mother board 540 with mother board cable connectors 550 thereon. Disposed on an opposite side of mother board 540 from mother board cable connectors 550 is internal mother board/test station edge connector 2298, which couples with internal test station/mother board interface edge connector 2297 of FIG. 4. Mother board 540 may be any printed circuit board which distributes signals provided thereto to various other connectors.

Preferably mother board 540 is mounted within rigid inter-connection TUA 2220 using known mounting techniques and simultaneously allowed to float therein in at least three orthogonal directions. This float allows for realignment of rigid inter-connections between the test station 130, rigid inter-connection TUA 2220 and the rigid TUA/test station connector assemblies 2290. Any of various known techniques of providing float may be used for parts preferably having float, such as rigid TUA/test station connector assembly 2290, and the TUA/test station connector pins 2295 used therein. Mother board 540 also may be floated using various known techniques. In a preferred embodiment, computer aided design (CAD) equipment may be used, as well as techniques of Geometric Dimensioning and Tolerancing (GDT) in which predetermined tolerances are set and mapped and matched, as well as translation of virtual conditions. It is believed that use of such techniques will enhance the ability to successfully deploy rigid circuit cards and accomplish their rigid inter-connection within the rigid TUA/test station connector assembly 2290 which is then blind mated to test station 130. The terms "rigid electrical connection" or "rigid inter-connection" are used herein to generically describe the mating of two rigid circuit cards using directly mating pins on one circuit card with sockets on another circuit card. This is clearly distinguished from situations where terminal blocks etc. may be connected to other connectors via individual wires or cables.

Coupling LRU side cable connectors 530, side port connectors 510, and mother board cable connectors 550 are cable connectors (not shown), which may be ribbon cables or any other suitable cable connector.

In operation, the present invention accomplishes the goal of connecting an avionics line replaceable unit with an avionics test station by using a rigid inter-connection TUA 2220, which allows for a standard connection via avionics line replaceable unit TUA/LRU connector 124 to the avionics line replaceable unit, which then is coupled by wires and/or cables or otherwise to LRU side distribution card 520, which is coupled by ribbon cables or otherwise to mother board 540. LRU side distribution card 520 and mother board 540 are manufactured to address the signal distribution needs of specific avionics line replaceable units. Since the distribution needs are known and met by the circuitry on LRU side distribution card 520 and mother board 540, the cables connecting LRU side distribution card 520 and mother board 540 may be commercially available ribbon cables or other cables (not shown), which allow for simple, quick, and sturdy connections. The need to individually hand wire connections between the avionics line replaceable unit TUA/LRU connector 124 and the TUA/test station connector 129 has been eliminated, or at least greatly reduced, thereby providing several benefits. The mother board 540 is then coupled via a rigid connection to rigid TUA/test station connector assembly 2290 via internal mother board/test station edge connector 2298 and internal test station/mother board interface edge connector 2297. This rigid connection eliminates the need for additional hand wiring at this point. Rigid TUA/test station connector assembly 2290 is then coupled to the test station 130 preferably through TUA/test station connector pin 2295, which is also capable of floating.

It is thought that the method and apparatus of the present invention will be understood from the foregoing description and that it will be apparent that various changes may be made in the form, construct steps and arrangement of the parts and steps thereof without departing from the spirit and scope of the invention or sacrificing all of their material advantages. The form herein described is merely a preferred exemplary embodiment thereof.

I claim:

1. A system of a type having an avionics rack, on an aircraft, for containing a plurality of avionics line replaceable units, and further having a first rack/line replaceable unit connector, said plurality of avionics line replaceable units comprising a first avionics replaceable unit, coupled to said avionics rack, the improvement comprising:

a test unit adapter having a second rack/line replaceable unit connector, a test unit adapter/test station connector, and a rigid electrical connection between two printed circuit boards, disposed therebetween;

said test unit adapter is disposed outside of said aircraft;

a second avionics line replaceable unit, having an avionics line replaceable unit rear blind mating connector thereon, which has a predetermined configuration so as to be readily mated with said first rack/line replaceable unit connector, said predetermined configuration further configured so as to be readily mated to said second rack/line replaceable unit connector; and, a test station coupled to said test unit adapter, said test station for testing said second avionics line replaceable unit.

2. An adapter comprising:

a first connector coupled with an avionics line replaceable unit;

a second connector coupled with an avionics test station disposed outside of an aircraft; and, a plurality of rigid circuit boards, disposed in said adapter, and electrically coupling said first connector and said second connector, where said rigid circuit boards are connected to each other through a rigid electrical connection.

3. The adapter of claim 2 wherein said rigid electrical connection is a pin and socket connector.

4. The adapter of claim 3 wherein said pin and socket connector is an edge-mounted pin and socket connector.

5. The adapter of claim 2 wherein each of said plurality of circuit boards is simultaneously mounted to said adapter and allowed to float in said adapter in at least two orthogonal directions.

6. A rigid inter-connection test unit adapter comprising:

said test unit adapter is disposed outside of an aircraft;

an avionics line replaceable unit test unit adapter/line replaceable unit connector for coupling with an avionics line replaceable unit;

a mother board mounted in said rigid inter-connection test unit adapter and having an ability to float in at least one direction;

a rigid test unit adapter/test station connector assembly mounted therein and having an ability to float in at least one direction;

said mother board and said rigid test unit adapter/test station connector assembly are coupled to each other through a rigid electrical connection.

7. The rigid inter-connection test unit adapter of claim 6 wherein said rigid electrical connection is an edge-mounted pin and socket connector, where a pin is disposed on said rigid test unit adapter/test station connector assembly, and a socket is disposed on said mother board.

8. A rigid inter-connection test unit adapter of claim 6 wherein said rigid electrical connection is an edge-mounted pin and socket connector where a pin is disposed on said mother board, and a socket is disposed on said rigid test unit adapter/test station connector assembly.

9. A rigid inter-connection test unit adapter of claim 8 wherein said rigid test unit adapter/test station connector assembly includes a floating pin for mating with a socket in a test station.

10. An avionics test unit adapter comprising:

said avionics test unit adapter is disposed outside of an aircraft, means for electrically coupling with an avionics line replaceable unit;

means for electrically coupling with an avionics test station;

means for rigidly coupling a plurality of circuit boards to provide a signal path between said means for electrically coupling with an avionics line replaceable unit and said means for electrically coupling with an avionics test station.

11. The avionics test unit adapter of claim 10 wherein said means for rigidly coupling comprises a first circuit card and a second circuit card.

12. The avionics test unit adapter of claim 11 further comprising a frame wherein said first circuit card is mounted in said frame.

13. The avionics test unit adapter of claim 12 wherein said first circuit card is allowed to float in at least one direction within said frame.

14. The avionics test unit adapter of claim 13 wherein said second circuit card is allowed to float in at least one direction within said frame.

15. The avionics test unit adapter of claim wherein said first circuit card and said second circuit card are coupled through an edge-mounted pin and socket connector, and both said first circuit card and said second circuit card are allowed to float in unison in at least one direction.

16. The avionics test unit adapter of claim 15 wherein said means for electrically coupling with an avionics test station includes a floating pin coupled to said first circuit card.

17. A method of connecting an avionics line replaceable unit with an avionics test station comprising the steps of:

providing a first connector coupled with an avionics line replaceable unit;

providing a second connector coupled with an avionics test station which is disposed outside of an aircraft;

providing a mother board for distributing signals provided by said first connector and said second connector;

coupling said mother board with said first connector;

rigidly coupling said mother board with a second circuit board; and, coupling said second circuit board with said second connector.

18. The method of claim 17 wherein said step of rigidly coupling said mother board to said second circuit board uses a pin and socket connector.

19. The method of claim 18 wherein said step of providing a mother board includes mounting said mother board in a frame with an ability to float in at least one direction.

20. The method of claim 19 wherein said step of coupling said second circuit board with said second connector includes using a floating pin which mates with said avionics test station.

* * * * *